Figure 1:
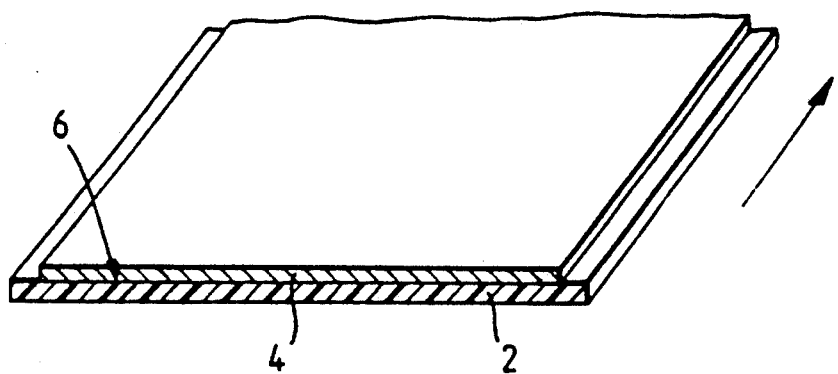

United States Patent [19]

Allford

[11] Patent Number: 5,253,584

[45] Date of Patent: * Oct. 19, 1993

[54] PYROTECHNIC MATERIALS

[75] Inventor: Frederick G. Allford, Kent, England

[73] Assignee: The Secretary of State for Defence in Her Britannic Majesty's Government of the United Kingdom of Great Britain and Northern Ireland, Whitehall, England

[*] Notice: The portion of the term of this patent subsequent to Feb. 25, 2009 has been disclaimed.

[21] Appl. No.: 777,220

[22] PCT Filed: Mar. 9, 1990

[86] PCT No.: PCT/GB90/00360

§ 371 Date: Nov. 6, 1991

§ 102(e) Date: Nov. 6, 1991

[87] PCT Pub. No.: WO90/10724

PCT Pub. Date: Sep. 20, 1990

[30] Foreign Application Priority Data

Mar. 13, 1989 [GB] United Kingdom ................. 8905747

[51] Int. Cl.⁵ ............................................. F42B 3/18
[52] U.S. Cl. ............................ 102/202.7; 102/202.5; 428/421; 428/422; 428/461; 428/906; 524/330
[58] Field of Search ............ 428/421, 422, 461, 906; 524/330; 102/202.5, 202.7

[56] References Cited

U.S. PATENT DOCUMENTS

| 2,898,228 | 8/1959 | Kelley | 428/421 |
| 3,163,113 | 1/1959 | Davis et al. | 102/98 |
| 3,549,436 | 12/1970 | Rocca | 149/15 |
| 3,666,967 | 5/1972 | Keister et al. | 428/428 |
| 3,802,970 | 4/1974 | Bishop et al. | 149/15 |
| 3,995,559 | 12/1976 | Bice et al. | 102/100 |
| 4,128,530 | 12/1978 | Cottman | 524/330 |
| 4,405,678 | 9/1983 | Downing et al. | 428/461 X |
| 4,715,280 | 12/1987 | Wittwer | 102/202.8 |
| 4,766,813 | 8/1988 | Winter et al. | 102/307 |
| 4,976,200 | 12/1990 | Benson et al. | 102/202.7 |
| 5,090,322 | 2/1992 | Allford | 102/202.7 |

FOREIGN PATENT DOCUMENTS

WO90/10611 9/1990 World Int. Prop. O. .

Primary Examiner—Stevan A. Resan
Attorney, Agent, or Firm—Nixon & Vanderhye

[57] ABSTRACT

A pyrotechnic material consists of an oxidizable metal vapor-deposited onto a substrate film of an oxidizing polymeric material the metal and polymeric substrate being conjointly capable of exothermic reaction on ignition. The substrate may be provided in flexible film tape form and coated on both sides with metal to provide a flash transfer medium with flash velocities typically within the range 10-100 ms$^{-1}$. The substrate is preferably PTFE and the metal magnesium.

17 Claims, 2 Drawing Sheets

PYROTECHNIC MATERIALS

This invention relates to pyrotechnic materials, in particular but not exclusively suitable for use in pyrotechnic trains such as single and multi-train delay systems. The invention also relates to the use of such pyrotechnic materials in pyrotechnic trains.

It is well known that a wide range of pyrotechnic materials may be prepared in granular form by carefully selecting, preparing, and mixing together oxidising and oxidisable materials in specific ratios in order to achieve desired burning characteristics. Typical among such known granular combinations are oxidising polymers (such as fluoro-and chlorofluoro-hydrocarbon polymers) and oxidisable metals (such as magnesium), which in admixture are used as ignitors for propellant charges and as flare compositions for emitting infrared and smoke signals. Pyrotechnic compositions of this type are disclosed in, for example, U.S. Pat. Nos. 3,669,020 and 3,983,816 and U.S. Statutory Invention Registration H169.

Granular pyrotechnic compositions of the type consisting of polymer/metal mixtures suffer from a number of drawbacks. They are generally difficult to ignite, especially so when high energy ingredients are selected such as magnesium and polytetrafluoroethylene (PTFE). Great care must be taken in selecting ingredients of the correct particle size and shape, in mixing the ingredients in the correct ratio and in packing the composition to the correct density in a finished product since all these factors can have a considerable effect on burning characteristics. Such granular compositions can be extremely hazardous to handle, since they are liable to ignite spontaneously whilst undergoing formulation and further processing into end products. This necessitates clean room assembly conditions and the adoption of other elaborate and time-consuming safety procedures.

It is an object of the present invention to provide a pyrotechnic material whereby the aforementioned disdvantages of granular pyrotechnic compositions are overcome or at least mitigated in part.

According to the present invention, a pyrotechnic material comprises a substrate film of an oxidising polymeric material having vapour deposited thereon at least one layer of an oxidisable metallic material in at least one location on the surface of the substrate, the at least one layer being at least 2 microns thick and the said polymeric and metallic materials being conjointly capable of reacting together exothermically on ignition.

The advantage of vapour deposition is that it maximises molecular intermingling of the polymeric and metallic materials at their interface to provide a large, intimate and essentially void-free contact area between the two. The resulting pyrotechnic material exhibits considerable resistance to spontaneous ignition. Controlled ignition of the conjoint oxidising and oxidisable materials at any selected location initiates a self-sustaining, exothermic reaction between the two materials which progresses laterally along the interface. Intimate interfacial contact is further enhanced by the nature of vapour deposition processes which are conventionally conducted in essentially oxygen-free environments such as a vacuum or a low pressure inert atmosphere, so preventing the formation of an inhibiting film of metal oxide between the metallic and polymeric materials. This in turn renders the present pyrotechnic material easier to ignite than its granular counterparts. Furthermore, vapour deposition ensures that the advantageous properties of the polymeric substrate starting material (such as flexibility, strength, and toughness) are not substantially degraded during the manufacture of the pyrotechnic product.

The substrate may be made from one or more of a variety of polymeric materials which are preferably pliant. To enable an exothermic reaction to occur between the metallic material and the substrate, the polymeric material must contain an atom chemically bound to the polymer structure that is capable of oxidising the metal, and suitable atoms include halogens (which are preferred, especially fluorine), oxygen, sulphur, nitrogen and phosphorus.

The substrate is preferably wholly or partly made of a halogenated polymer. The substrate may be made wholly of such a halogenated polymer or may alternatively be made of a mixture of a halogenated polymer and one or more other polymers and/or may alternatively have a surface layer made wholly or partly of a halogenated polymer. In order to provide a high energy polymer/metal combination in the present pyrotechnic material, the halogenated polymer is preferably a fluoropolymer or a fluorochloropolymer, especially a fluoroalkylene polymer or a fluorochloroalkylene polymer. The most preferred polymer is polytetrafluoroethylene (PTFE) which gives potentially the highest energy content pyrotechnic material. Other suitable polymers known to react exothermically with metal fuels such as Mg include, polyhexafluoropropylene, the copolymers of vinyledene fluoride and hexafluoropropylene, copolymers of tetrafluoroethylene and perfluoropropylene, copolymers of chlorotrifluoroethylene and vinylidene fluoride, homopolymers of perfluoropropylene and its copolymers with vinylidene fluoride, trifluorochloroethylene homopolymer and its copolymers with vinylidene fluoride, and mixtures of two or more such polymers with each other or with PTFE.

The thickness and composition of the metal material layer is selected to ensure reliable and consistent lateral progression characteristics of the exothermic reaction. If the layer is too thick, the reaction may self extinguish due to excessive heat conduction from the interface into the metal layer itself, whereas if too thin then insufficient heat will be generated by the reaction to sustain lateral progression. For this reason the layer is preferably from 2 to 100 microns thick, most preferably from 3 to 50 microns thick.

The at least one metallic material layer may comprise a single metal, or two or more metals co-deposited as an alloy. The selected metal is preferably one which gives a high heat output when undergoing exothermic reaction with the oxidising polymer, especially with a halogenated polymer. For this reason, it is particularly preferred that the at least one metallic material layer comprises magnesium or a magnesium alloy for example with lithium, this being an alloy that undergoes a more exothermic reaction with the type of polymeric materials outlined above than magnesium alone, or with aluminium. The metallic material layer may comprise an alternative metal or an alloy thereof, particularly an alternative metal known to react with halogenated polymers, such as boron, beryllium, calcium, strontium, barium, sodium, lithium, aluminium, titanium or zirconium. A layer of magnesium or magnesium alloy 3-50 microns thick, especially 5-25 microns thick, is preferred, for example deposited on PTFE as described above. Vapour deposition of Mg or a Mg alloy onto a fluorinated polymer is found to be particularly advantageous because a particularly adherent metallic layer is formed, possibly due in part to a degree of chemical bonding which takes place at the interface during vapour deposition.

To moderate the exothermic reaction the metallic material may be deposited as two or more layers, with adjacent layers interlayed with a vapour-deposited layer of a moderating material (such as lead) which does not readily react exothermically with the substrate.

The pyrotechnic material of this invention may be made using general techniques of vapour deposition onto substrates which are well known in the deposition art. The preferred method of deposition for metals is physical vapour phase deposition, in which a vapour of the layer material, such as a metal e.g. magnesium, is caused to condense onto the surface of the substrates. If the metallic material layer is an alloy then two or more metals must be vapour deposited simultaneously onto the substrate. Deposition may be carried out in a vacuum or in a low pressure (sub-atmospheric) atmosphere of an inert gas such as argon.

For some useful applications of the present pyrotechnic material, it is desirable that the polymeric substrate be substantially consumed by the exothermic reaction in order to promote maximum heat generation for the amount of pyrotechnic material employed. In these applications, the substrate is supplied in the form of a film of material especially a flexible film, in order to ensure complete combustion takes place. One particularly preferred form is a tape of flexible film, which has the advantage that it can be rolled up for example on a cylindrical former for storage and (in certain applications) subsequent use.

The substrate film is coated on at least one surface with the metallic material. It is however more preferred to deposit metallic layers on both sides of the film to form a metallic material-polymeric material-metallic material composite. This preferred composite arrangement has the advantage of reducing the build-up of static electrical charges on the otherwise exposed surface of the polymeric film and so reduces the possibility of accidental ignition of the pyrotechnic material. It also has the advantage of doubling the contact area between the metallic and polymeric materials, so improving the lateral progression characteristics of the exothermic reaction.

Preferably, the relative proportions of substrate film and metallic material are such that at least at the location of the film underlying the layer or layers of metallic material, the ratio of substrate to metallic material is substantially stoichiometric for the exothermic reaction but variation of the relative proportions of preferably within ±20% of the stoichiometric amounts may be used to control the combustion rate. The thickness of the film is in general determined by practical considerations. If the film is too thick, its complete combustion cannot be assured whereas manufacturing requirements will generally set the minimum thickness at which the film can be prepared. For these reasons, the film thickness is preferably between 5 and 200 microns, more preferably between 10 and 100 microns.

The present coated film pyrotechnic material has several applications. In one applications the material may be used as a flash transfer medium. Such a medium will in general comprise one or more longitudinal strips of the material enclosed in a containment sleeve, preferably a heat-shrunk plastics sleeve. The resilience and flexibility of the film lends to the medium the desirable characteristics of robustness, flexibility and reliability. Furthermore, if the film is made of a substantially hydrogen-free polymer such as PTFE, the exothermic reaction between film and metallic layer or layers will be essentially gasless, so that if made strong enough the containment sleeve will contain the products of combustion without rupturing. Typically, the amount of pyrotechnic material used will be 0.05-10, preferably 0.1-5, grammes per metre of medium.

In a further application of the present coated film material the material may be spirally overwound on itself into a rolled configuration which has been found suitable for use as a propellant charge. A cylindrical roll is ideally shaped to fit within the typically cylindrical interior of a rocket motor case. The burning rates of spirally overwound coated film materials are typically many times that achievable by conventional solid propellants for rocket motors, so that they are most useful in applications where very rapid projectile accelerations are required, such as in short-range missile launch systems and/or in recoil-less guns. Furthermore, if the metallic/polymeric material combination is selected to produce an essentially gasless exothermic reaction, the products of combustion will condense rapidly and so reduce blast effects in the immediate vicinity of projectile launch. The number of film windings will affect burning rate, because as they increase the bulk of the film will become increasingly confined by overlaid material to produce a general increase in burning rate.

If the film is coated on both sides and is rolled up with a second, insulating film, then the charge can be used as an electrical capacitor with the metallic material layers acting as separate capacitor plates, and so can be electrically charged to store electrical energy required for its own ignition. A similar effect can be produced by rolling together two films of material placed one on top of the other, both films being coated on one side only and each metallic material coating facing the uncoated side of the adjacent film in contact with it. By analogy, a similar effect may be produced by stacking several coated films on top of each other, interleaved with layers of insulating film where appropriate, to provide a flat plate capacitor.

Overall, the present pyrotechnic materials generally have the advantage of simplicity of manufacture, safe manufacture and handling, reliability, low cost, low weight, ease of ignition, flexibility, robustness, and stability.

Figure 2:
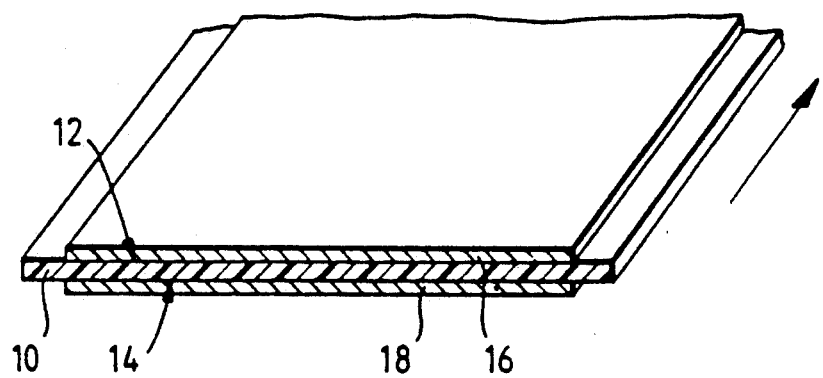
Figure 3:
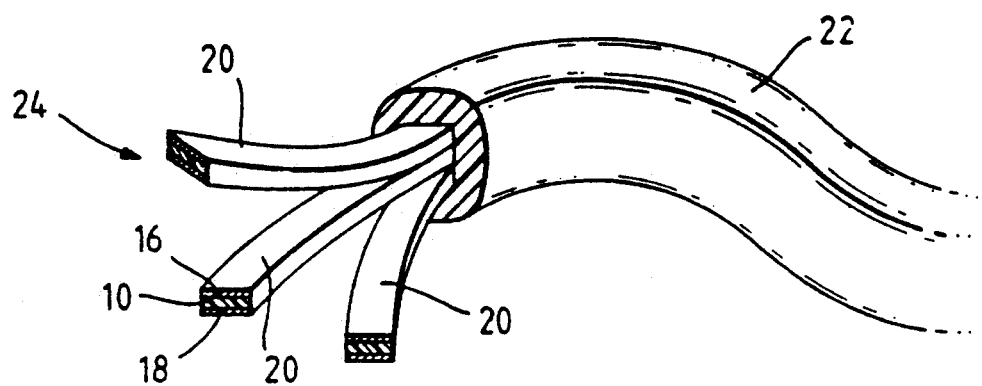
Figure 4:
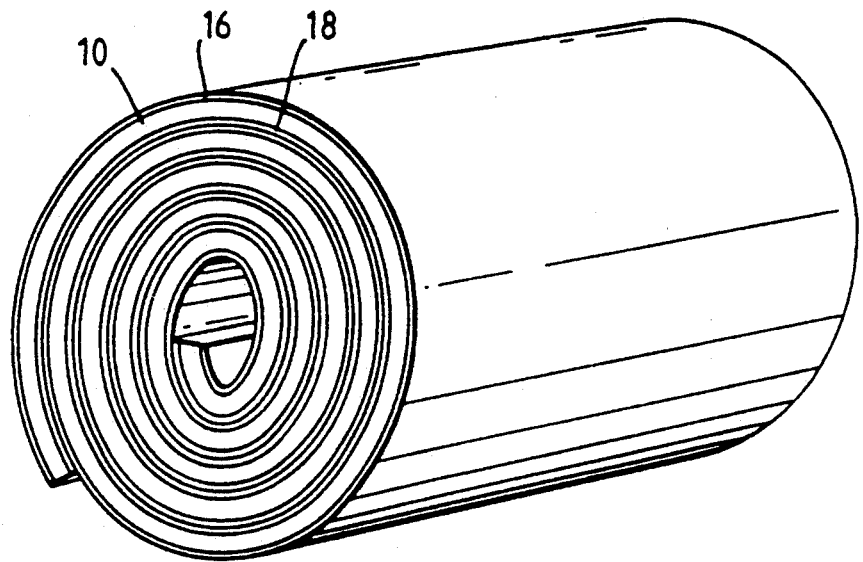
Figure 5:
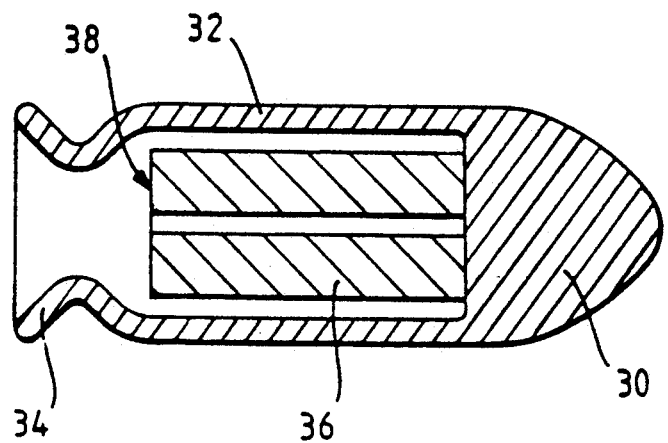

Embodiments of the pyrotechnic materials according to this invention and their uses will now be described by way of example only with reference to the accompanying drawings in which FIGS. 1 and 2 show perspective part sectional views of pyrotechnic materials, FIG. 3 shows a perspective part-sectional view of flash transfer cord employing the material illustrated in FIG. 2, FIG. 4 shows a perspective view of a propellant charge made from the material illustrated in FIG. 2, and FIG. 5 shows a longitudinal sectional view through a missile incorporating the propellant charge illustrated in FIG. 4.

Referring first to FIG. 1, a first pyrotechnic material consists of a substrate comprising an oxidising polymeric film tape 2, (for example, of PTFE) having a single layer 4 of an oxidisable metallic material (for example, magnesium) deposited on one surface 6 thereof. The direction of the long axis of the tape 2 is indicated by an arrow. The layer 4 is deposited using conventional vacuu deposition equipment (not shown). The deposition source material may be located in a separate vaporising boat (not shown) and vaporised by a scanned electron beam in an atmosphere of argon. Alternatively, the source may comprise a bar of material which is subjected to magnetron sputtering.

Referring to FIG. 2, a second pyrotechnic material consists of an oxidising polymeric film tape 10 coated on both of its surfaces 12 and 14 with layers 16 and 18 respectively of an oxidisable metal. Again, conventional vapour deposition techniques are used to deposit the layers 16 and 18.

The first and second pyrotechnic materials illustrated in FIGS. 1 and 2 can be edge-trimmed prior to use to remove uncoated film.

In one example of the second pyrotechnic material PTFE film tape 5 cm wide and 45 microns thick was coated on both sides with a layer of magnesium 16 microns thick by vapour deposition at a rate of $5 nm\ s^{-1}$. This thickness of Mg (32 microns in total) equated to an approximately stoichiometric ratio of Mg to PTFE according to the equation

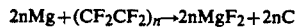

$$2nMg + (CF_2CF_2)_n \rightarrow 2nMgF_2 + 2nC$$

which describes the exothermic reaction between these two substances. A slight excess of Mg (for example of between 2% and 10%) may be preferred in certain circumstances to ensure complete conversion of available fluorine to $MgF_2$ so inhibiting the formation of toxic combustion gases.

The coated PTFE tape was found to retain the same strength and flexibility as the PTFE tape prior to coating and the layers of Mg showed no tendency to delaminate even when the coated tape was crumpled in the hand. The coated tape was found to be highly insensitive to mechanical impact and was found not to ignite when placed on a flat hard surface and struck with moderate force with a hand-held 0.5 kg hammer. The coated PTFE tape was also found to have a lower and more reproducible ignition temperature (543°±3° C.) than that of a conventional compressed mixture of particulate PTFE and particulate magnesium to the same stoichiometric ratio (ignition temperature 610°±10° C.). Furthermore, microscopic examination of the coated tape showed the presence of an adherent black film at the interface between the PTFE and magnesium, indicating that an exothermic reaction had taken place between the two materials during the deposition process. In practice, the tape could be ignited by applying 4 volts across two closely spaced single point contacts on the metallic surface of the coated tape to create a short-circuit and hence localised heating between these two points, and unconfined the exothermic reaction between the Mg and PTFE proceeded along the tape at a velocity of several metres per second. This velocity could be altered by altering the relative thicknesses of the tape 10 and layers 16 and 18.

Referring to FIG. 3, a flash transfer cord is shown which consists of three longitudinal strips 20 of coated tape encased within a sleeve 22 of a heat-shrunk plastics material. The strips 20 are cut from coated tape of the type illustrated in FIG. 2. The sleeve 22 is heat-shrunk onto the strips 20 in order to provide adequate protection for and confinement of the strips. When ignition is applied to one open end 24 of the cord, combustion is rapidly communicated along its length in the direction shown by the arrow. By varying the relative thickness of the tape 10 and the layers 16 and 18, and in particular by varying the degree of consolidation and confinement of the strips 20, the rate and speed of combustion along the cord can be varied.

In one specific example of a flash transfer cord in accordance with the embodiment, three 2 mm wide strips of 45 micron thick PTFE film tape coated on both sides with a thickness of about 16 microns of magnesium, were confined within a 4 mm diameter Viton tube ("Viton" is a fluorinated polymeric material). The tube was heat shrunk onto the strips. The cord had a total pyrotechnic material content of about 1 g per metre of length. When ignited at one end by the application of a localised short circuit to one of the strips, combustion of the confined strips proceeded along the cord at a velocity of the order of $100\ ms^{-1}$. The tube was not significantly ruptured because the exothermic reaction between PTFE and Mg produces gaseous reaction products which condense at high temperature.

In FIG. 4 there is illustrated a propellant charge consisting of the coated PTFE tape (10, 16, 18) illustrated in FIG. 2, edge-trimmed to remove uncoated PTFE, which has been rolled up into a cylindrical overwound configuration.

In FIG. 5, a missile is shown which comprises a nose portion 30, a cylindrical body portion 32 comprising a rocket motor case, and a rocket nozzle 34. Enclosed coaxially with the motor case 32 is a cylindrical propellant charge 36 comprising the charge illustrated in FIG. 4. A missile according to the embodiment was constructed with an overall mass of 60 g and a propellant charge mass of 9 g. The propellant charge 36 was prepared by rolling up a short length of the 5 cm wide Mg-coated PTFE film tape described above. The charge was ignited at its rear-end face 38 using the flash transfer cord illustrated in FIG. 3, and was completely consumed within milliseconds of its ignition to accelerate the missile to a terminal velocity of $200\ ms^{-1}$.

I claim:

1. A pyrotechnic material comprising a substrate film of an oxidizing halogenated polymeric material and at least one layer 2 to 100 microns thick of an oxidizable metallic material vapor deposited onto the surface of the polymeric material in at least one location, wherein the polymeric and metallic materials are conjointly capable of reacting together exothermically on ignition, the thickness and composition of the metallic material being such as to ensure reliable and consistent lateral progression of the exothermic reaction.

2. The pyrotechnic material according to claim 1 having a layer of oxidizable metallic material vapor deposited on both sides of the substrate film.

3. The pyrotechnic material according to claim 1 wherein the metallic material comprises a metal selected from the group consisting of lithium, sodium, magnesium, beryllium, calcium, strontium, barium, aluminum, titanium, zirconium, and alloys thereof.

4. The pyrotechnic material according to claim 3 wherein the metallic material comprises a metal selected from the group consisting of magnesium and an alloy thereof.

5. The pyrotechnic material according to claim 1 wherein the thickness of each layer of metallic material is between 3 and 50 microns.

6. The pyrotechnic material according to claim 1 wherein the substrate comprises a fluorinated polymer.

7. The pyrotechnic material according to claim 6 wherein the substrate comprises a fluoropolymer.

8. The pyrotechnic material according to claim 7 wherein the polymeric material comprises PTFE and the metallic material comprises magnesium.

9. The pyrotechnic material according to claim 1 wherein the substrate film comprises a flexible film tape.

10. The pyrotechnic material according to claim 1 wherein the thickness of the substrate film is between 5 and 200 microns.

11. The pyrotechnic material according to claim 10 wherein the thickness of the substrate film is between 10 and 100 microns.

12. The pyrotechnic material according to claim 1 wherein the relative proportions of substrate film and metallic material are such that, at least at the location of the layer of metallic material, the ratio of substrate to metallic material is within 20% of the stoichiometric ratio for the exothermic reaction.

13. The pyrotechnic material according to claim 1 wherein it is wound into a cylindrical roll configuration.

14. A propellant charge incorporating a pyrotechnic material comprising a substrate film of an oxidizing halogenated polymeric material and at least one layer 2 to 100 microns thick of an oxidizable metallic material vapor deposited onto the surface of the polymeric material in at least one location, wherein the polymeric and metallic materials are conjointly capable of reacting together exothermically on ignition, the thickness and composition of the metallic material being such as to ensure reliable and consistent lateral progression of the exothermic reaction, wherein the pyrotechnic material is wound into a cylindrical roll configuration.

15. A flash transfer medium incorporating at least one longitudinal strip of pyrotechnic material comprising a substrate film of an oxidizing halogenated polymeric material and at least one layer 2 to 100 microns thick of an oxidizable metallic material vapor deposited onto the surface of the polymeric material in at least one location, wherein the polymeric and metallic materials are conjointly capable of reacting together exothermically on ignition, the thickness and composition of the metallic material being such as to ensure reliable and consistent lateral progression of the exothermic reaction, wherein the pyrotechnic material is enclosed within a protective sleeve.

16. The flash transfer medium according to claim 15 wherein three longitudinal strips of pyrotechnic material are enclosed within a heat shrunk protective sleeve.

17. An electrical capacitor incorporating pyrotechnic material comprising a substrate film of an oxidizing halogenated polymeric material and at least one layer 2 to 100 microns thick of an oxidizable metallic material vapor deposited onto the surface of the polymeric material in at least one location, wherein the polymeric and metallic materials are conjointly capable of reacting together exothermically on ignition, the thickness and composition of the metallic material being such as to ensure reliable and consistent lateral progression of the exothermic reaction, wherein the pyrotechnic material is configured such that a plurality of layers of metal are interleaved with a plurality of layers of insulating film.

* * * * *